United States Patent
Tamura et al.

(10) Patent No.: US 9,123,561 B2
(45) Date of Patent: Sep. 1, 2015

(54) SUPERJUNCTION SEMICONDUCTOR DEVICE

(71) Applicant: FUJI ELECTRIC CO., LTD., Kawasaki-shi (JP)

(72) Inventors: Takahiro Tamura, Matsumoto (JP); Yasuhiko Onishi, Matsumoto (JP); Mutsumi Kitamura, Matsumoto (JP)

(73) Assignee: FUJI ELECTRIC CO., LTD. (JP)

( * ) Notice: Subject to any disclaimer, the term of this patent is extended or adjusted under 35 U.S.C. 154(b) by 206 days.

(21) Appl. No.: 13/657,164

(22) Filed: Oct. 22, 2012

(65) Prior Publication Data

US 2013/0099347 A1   Apr. 25, 2013

(30) Foreign Application Priority Data

Oct. 21, 2011   (JP) ................. 2011-232189

(51) Int. Cl.
*H01L 29/66* (2006.01)
*H01L 29/08* (2006.01)
*H01L 29/78* (2006.01)
*H01L 29/06* (2006.01)
H01L 29/40 (2006.01)
H01L 29/10 (2006.01)

(52) U.S. Cl.
CPC ........ *H01L 29/0878* (2013.01); *H01L 29/0619* (2013.01); *H01L 29/0634* (2013.01); *H01L 29/7811* (2013.01); H01L 29/0638 (2013.01); H01L 29/0696 (2013.01); H01L 29/1095 (2013.01); H01L 29/404 (2013.01)

(58) Field of Classification Search
USPC .................. 257/493, 329, E29.262
See application file for complete search history.

(56) References Cited

U.S. PATENT DOCUMENTS 5,216,275 A   6/1993   Chen
5,438,215 A   8/1995   Tihanyi (Continued)

FOREIGN PATENT DOCUMENTS

JP   9-266311 A     10/1997
JP   2003-115589 A  4/2003

(Continued)

OTHER PUBLICATIONS

Japanese Office Action issued in Japanese counterpart application No. JP2011-232189, dated Jul. 7, 2015. Partial English translation provided.

*Primary Examiner* — Jamie C Niesz
(74) *Attorney, Agent, or Firm* — Rossi, Kimms & McDowell LLP

(57) ABSTRACT

A superjunction semiconductor device is disclosed in which the trade-off relationship between breakdown voltage characteristics and voltage drop characteristics is considerably improved, and it is possible to greatly improve the charge resistance of an element peripheral portion and long-term breakdown voltage reliability. It includes parallel pn layers of n-type drift regions and p-type partition regions in superjunction structure. PN layers are depleted when off-state voltage is applied. Repeating pitch of the second parallel pn layer in a ring-like element peripheral portion encircling the element active portion is smaller than repeating pitch of the first parallel pn layer in the element active portion. Element peripheral portion includes low concentration n-type region on the surface of the second parallel pn layer. The depth of p-type partition region of an outer peripheral portion in the element peripheral portion is smaller than the depth of p-type partition region of an inner peripheral portion.

8 Claims, 11 Drawing Sheets

(56) References Cited

U.S. PATENT DOCUMENTS

| | | |
|---|---|---|
| 6,097,063 A | 8/2000 | Fujihira |
| 7,812,392 B2 | 10/2010 | Saito et al. |
| 7,825,466 B2 | 11/2010 | Miura et al. |
| 2008/0290403 A1* | 11/2008 | Ono et al. ............... 257/329 |
| 2012/0126315 A1* | 5/2012 | Onishi et al. ............ 257/329 |

FOREIGN PATENT DOCUMENTS

| | | | |
|---|---|---|---|
| JP | 2003-152075 A | 5/2003 | |
| JP | 2005286023 A | 10/2005 | |
| JP | 2009004547 A | 1/2009 | |
| WO | 2011/013379 A1 | 2/2011 | |
| WO | WO 2011/013379 * | 2/2011 | ........... H01L 29/78 |

* cited by examiner

SUPERJUNCTION SEMICONDUCTOR DEVICE

BACKGROUND OF THE INVENTION

A. Field of the Invention

The present invention relates to a superjunction semiconductor device applicable to a MOSFET (insulated gate field effect transistor), IGBT (insulated gate bipolar transistor), bipolar transistor, or the like, with a high breakdown voltage and large current capacity appropriate for a resin mold seal structure.

B. Description of the Related Art

Generally, a vertical power semiconductor device has a structure in which an on-state current flows in a vertical direction between the main surfaces of a semiconductor substrate, and a depletion layer caused by a reverse bias voltage applied to a main junction when turning off extends in the vertical direction between the main surfaces. In order to obtain desired breakdown voltage characteristics in the vertical power semiconductor device, firstly, it is necessary to design a drift layer to a layer resistance and layer thickness commensurate with the desired breakdown voltage in order to prevent the critical electrical field strength of the silicon semiconductor device being reached, and breakdown occurring, at a breakdown voltage lower than the desired breakdown voltage. However, the higher the breakdown voltage becomes, the higher the resistance and the greater the thickness needed for the drift layer, meaning that it is normally unavoidable that the voltage drop (on-resistance) caused by the on-state current also increases. That is, in a vertical power semiconductor device, the breakdown voltage characteristics and voltage drop (on-resistance) characteristics are normally conflicting characteristics from the point of view of element structure design, and it is generally considered difficult to achieve a structure wherein both are simultaneously improved. The kind of relationship between the breakdown voltage characteristics and voltage drop characteristics described above relating to structure design of a vertical power semiconductor device is sometimes called a trade-off relationship.

A superjunction semiconductor device is known to be a semiconductor device in which it is possible to eliminate this kind of trade-off relationship and simultaneously improve both characteristics. The superjunction semiconductor device structure includes a parallel pn layer having plural n-type drift regions, with an impurity concentration (layer resistance) higher than an impurity concentration commensurate with the heretofore known design breakdown voltage, and p-type partition regions are alternately repetitively disposed in a vertical direction with respect to the main surfaces in the drift layer. It also has plural p-type junctions vertical with respect to the main surfaces (for example, refer to U.S. Pat. No. 5,216,275, U.S. Pat. No. 5,438,215, and JP-A-9-266311). With the superjunction semiconductor device, even when the drift layer impurity concentration is higher than the impurity concentration envisaged for the design breakdown voltage, when the depletion layer spreads from the pn junction between each region in the parallel pn structure when turning off, each region of the parallel pn structure is of a width small enough to be completely depleted at a low withstand voltage, meaning that it is possible to simultaneously achieve a low voltage drop (low on-resistance) and an increased breakdown voltage.

Meanwhile, in order for a vertical power semiconductor device to be a semiconductor element with a high breakdown voltage and high reliability, a breakdown voltage structure commensurate with a high breakdown voltage is needed in an element peripheral portion. This kind of breakdown voltage structure includes a structure, provided in a peripheral portion encircling an element active portion touching a main current path of the element, which has an electrical field concentration reduction function and charge resistance. The electrical field concentration reduction function is a function that reduces the electrical field concentration which is liable to occur at the drift layer terminal when applying an off-state voltage, thus preventing a low breakdown voltage breakdown. Charge resistance is a function that prevents a drop in breakdown voltage reliability, wherein a charge applied to the surface affects the extension of the depletion layer below the surface, and the breakdown voltage decreases along with the passing of time.

One example of a semiconductor device including a structure that ensures this kind of trade-off relationship elimination and a guarantee of long-term breakdown voltage reliability is already known. This semiconductor device firstly, in order to eliminate the trade-off relationship, includes a superjunction structure having the previously described parallel pn layer in the element active portion of the drift layer. Furthermore, the semiconductor device includes, in a peripheral portion of the element active portion, an element peripheral portion having a parallel pn layer of a lattice form plane pattern with a repeating pitch smaller than the pitch of the parallel pn layer of the element active portion. Further still, the semiconductor device is a superjunction semiconductor device having a structure wherein an n− region of a uniform concentration lower than the concentration of the parallel pn layer covers the surface of the lattice form parallel pn layer of the element peripheral portion. According to the superjunction semiconductor device, as it is possible to realize an element with low on-resistance and high breakdown voltage, and to prevent an overspreading of the depletion layer caused by a surface charge, it is possible to achieve an improvement in charge resistance (WO2011/013379).

With the superjunction semiconductor device described in WO2011/013379, however, although breakdown voltage charge resistance is ensured at a level of surface charge amount applied to the surface of the element peripheral portion in a range of $Qss=\pm 1.0\times 10^{12}$ cm$^{-2}$, there is a danger of a drop in breakdown voltage in the case of a resin mold seal that has an impurity ion concentration higher than the above level. That is, a charge resistance at a surface charge amount level of $Qss=\pm 1.0\times 10^{12}$ cm$^{-2}$ is insufficient for the superjunction semiconductor device to be a device of a resin mold seal structure. In order for the superjunction semiconductor device to be a resin mold seal structure superjunction semiconductor device that suppresses a drop in breakdown voltage and has high reliability, it is necessary to further improve the charge resistance.

The present invention is directed to overcoming or at least reducing the effects of one or more of the problems set forth above.

SUMMARY OF THE INVENTION

This invention provides a superjunction semiconductor device in which the trade-off relationship between breakdown voltage characteristics and voltage drop characteristics is considerably improved, it is possible to greatly improve the charge resistance of the element peripheral portion, and it is possible to improve long-term breakdown voltage reliability.

This superjunction semiconductor device includes parallel pn layers wherein a first conductivity type drift layer between one and the other two main surfaces of a first conductivity semiconductor substrate having a main junction that maintains off-state voltage has two regions formed of plural first conductivity type drift regions and second conductivity type partition regions disposed in alternate contact, and a p-n junction juxtaposed vertically to the main surfaces in the two regions, wherein the two regions each have a width of such an extent that a depletion layer spreading in the two regions from the pn junction between the two regions when an off-state voltage is applied to the main junction can deplete the drift layer, and have a structure wherein the repeating pitch of a second parallel pn layer in a ring-like element peripheral portion encircling an element active portion is smaller than the repeating pitch of a first parallel pn layer in the element active portion, through which a main current flows, the ring-like element peripheral portion includes a first conductivity type surface layer region, covering the surface of the second parallel pn layer, of an impurity concentration lower than that of the drift layer, and the depth of a second conductivity type partition region of an outer peripheral portion in the ring-like element peripheral portion is smaller than the depth of a second conductivity type partition region of an inner peripheral portion. It is also preferable that the superjunction semiconductor device includes two or more second conductivity type guard ring regions which are distanced from each other so as to surround the outer periphery of the first parallel pn layer in the surface layer of the low concentration first conductivity type surface layer region of the element peripheral portion, and includes a second conductivity type partition region, further to the outer peripheral side than the second conductivity type guard ring regions, with a depth smaller than that on the inner peripheral side. It is also possible that the plane pattern of the parallel pn layers in the element active portion and element peripheral portion is a combination of either a striped form or a lattice form.

According to the invention, it is possible to provide a superjunction semiconductor device in which the trade-off relationship between breakdown voltage characteristics and voltage drop characteristics is considerably improved, it is possible to greatly improve the charge resistance of the element peripheral portion, and it is possible to improve long-term breakdown voltage reliability.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Figure 1:
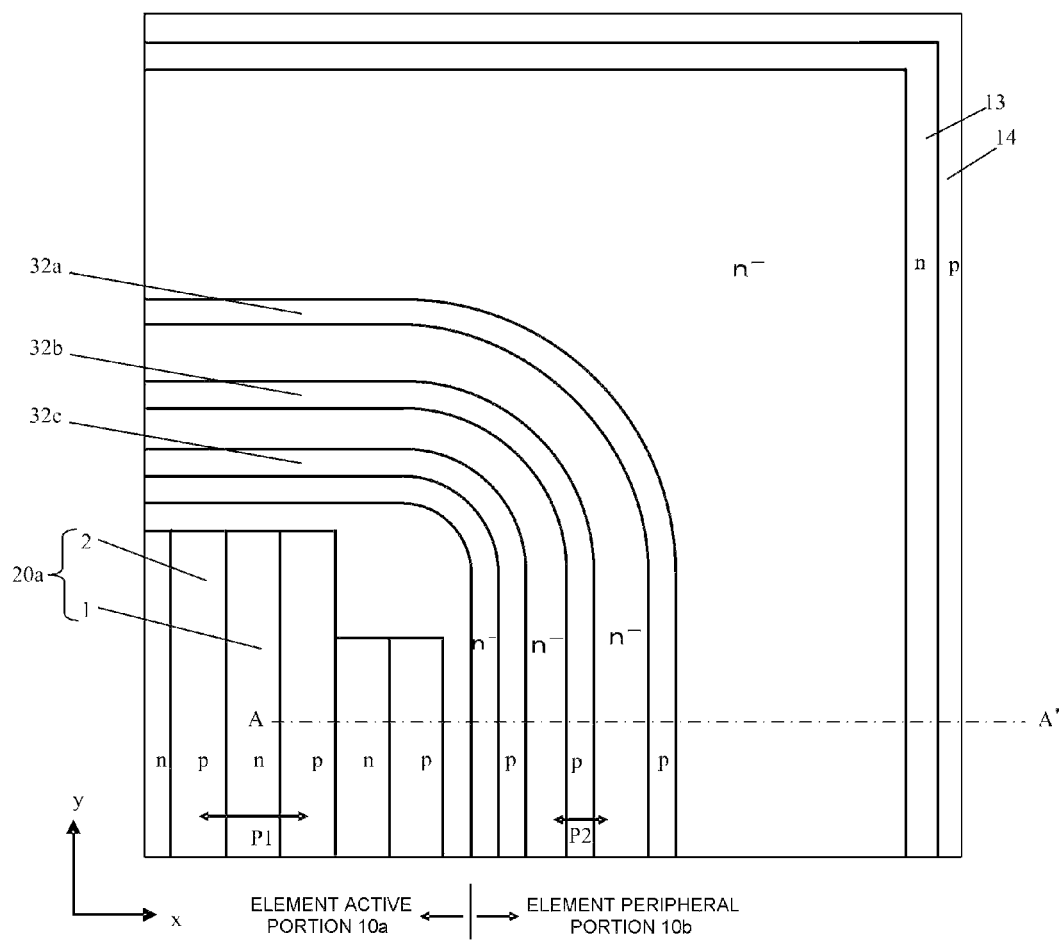
FIG. 1 is an internal plan view of a one-fourth element of a vertical superjunction MOSFET according to Embodiment 1 of the invention cut along a surface B-B' (shown in FIG. 4) parallel to a main surface.

Hereafter, a detailed description will be given, referring to the drawings, of embodiments according to a superjunction semiconductor device of the invention. The invention is not limited to the statements in the embodiments described hereafter, provided that the scope of the invention is not exceeded. A first conductivity type is described as an n-type, while a second conductivity type is described as a p-type.

A first conductivity type region (an n– region) with an impurity concentration lower than that of an underlying parallel pn layer is formed uniformly covering the parallel pn layer in the surface layer in an element peripheral portion of the superjunction semiconductor device of the invention, and furthermore, plural ring-like p-type guard rings that encircle element active portions are formed with predetermined intervals between them in the surface layer inside the n– region. Also, the superjunction semiconductor device is contrived based on it being possible to control an overspreading of the depletion layer when an off-state voltage is applied by the depth of a p-type partition region being caused to differ between the inner peripheral side and outer peripheral side in the element peripheral portion, with the depth of the p-type partition region on the outer peripheral side being less than that on the inner peripheral side, and thus possible to ensure charge resistance even when applying the superjunction semiconductor device as a resin mold seal, owing to which a drop in breakdown voltage is suppressed. Reasons for this will be described hereafter.

With a superjunction semiconductor device (referred to as a heretofore known element structure) described in WO2011/013379, the depletion layer extends too far in the element peripheral portion, reaching the channel stopper of the outermost peripheral portion, and in order to suppress a drop in breakdown voltage caused by an electrical field concentration occurring in the channel stopper, a structure is such that the extension of the depletion layer is suppressed by the repeating pitch of the parallel p-n layer being smaller in the element peripheral portion than in the element active portion. In a superjunction MOSFET having this kind of structure, even when a strong positive charge (positive ions) is applied to the surface of an insulating film on the surface of the element peripheral portion, the depletion layer is prevented from spreading too far and reaching the channel stopper by the n-type impurity concentration of the parallel pn layer in the element peripheral portion increasing, an avalanche breakdown occurs on the element active portion side, and charge resistance improves. However, in an environment (for example, a resin mold seal) in which a strong negative charge (negative ions) is applied to the surface of the element peripheral portion, there is a problem in that the n-type impurity concentration below the element peripheral portion decreases further, the depletion layer becomes more liable to spread, and an electrical field concentration is more likely to occur at an end of the channel stopper.

In response to this, in the invention a structure is adopted, in addition to the heretofore known element structure, in which the depth of the p-type partition region on the outer peripheral side of the element peripheral portion is further reduced, thereby reducing the p-type partition region. By adopting this kind of superjunction semiconductor device structure of the invention, a structure that suppresses an electrical field concentration in the channel stopper is obtained by the effective n-type impurity concentration increasing, thereby making it difficult for the depletion layer to spread, even in a case such as a resin mold seal wherein a strong negative charge (negative ions) is applied to the surface of the element peripheral portion. This point is a characteristic of the invention.

As the heretofore known element structure also includes the same kinds of surface n− region and p-type guard ring as the invention, breakdown voltage charge resistance with respect to a positive charge is obtained, but in general, in the case of an element peripheral portion having a guard ring structure, there is a tendency when a strong negative charge is applied to the surface for the depletion layer to spread as far as the channel stopper and for an electrical field concentration to occur, causing an avalanche and a drop in breakdown voltage. That is, when a negative charge is applied to the surface of the element peripheral portion, a tendency for breakdown voltage charge resistance to be weak is observed.

According to the superjunction semiconductor device of the invention, this point is improved. That is, in the invention, by the parallel pn layer repeating pitch in the element peripheral portion being smaller than that in the element active portion, and the depth of the p-type partition region being reduced only in the outer periphery of the element peripheral portion, it is possible to further control the spread of the depletion layer, and thus it is possible to improve breakdown voltage charge resistance with respect to a negative charge, which is a weak point of the heretofore known element structure. Consequently, it is possible to manufacture a superjunction semiconductor device wherein charge resistance is improved considerably more than with the heretofore known element structure.

Embodiment 1

Figure 2:
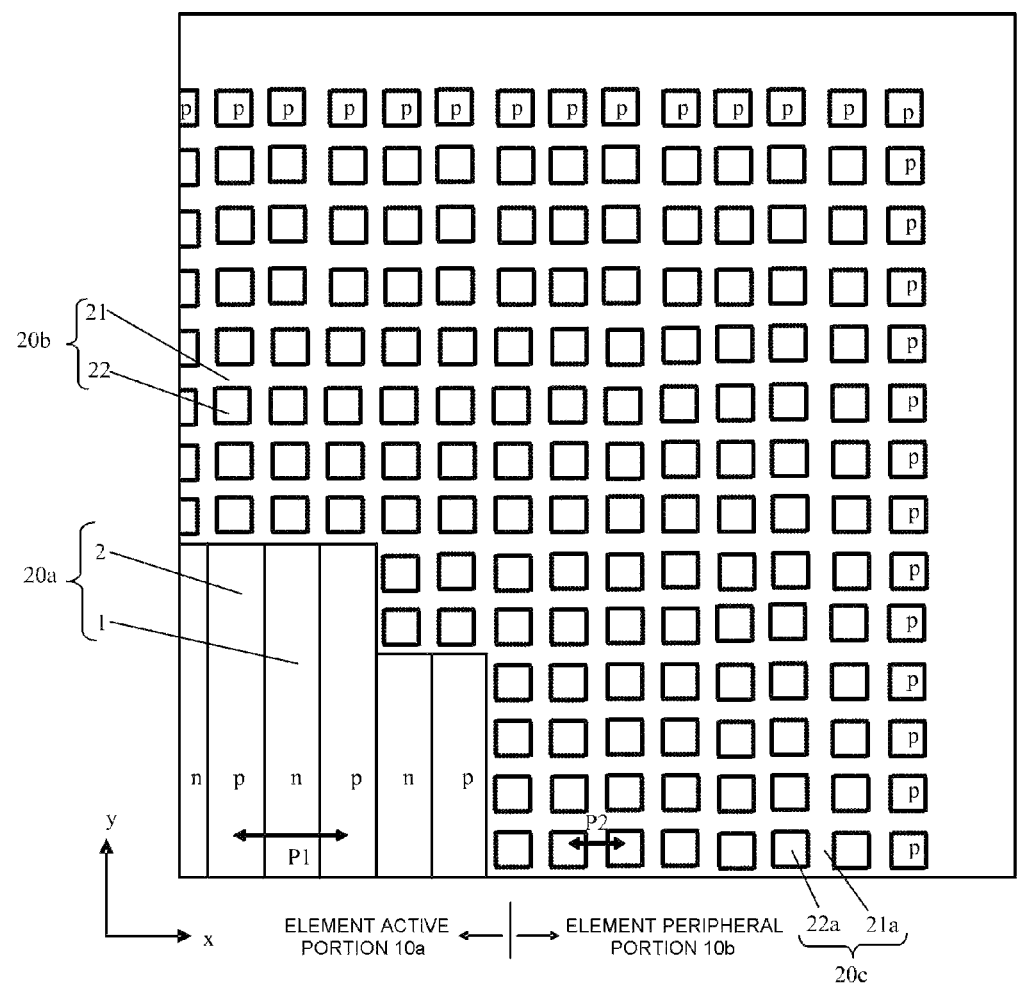
FIG. 2 is an internal plan view of the one-fourth element of the vertical superjunction MOSFET according to Embodiment 1 of the invention cut along a surface C-C' (shown in FIG. 4) parallel to a main surface.
Figure 3:
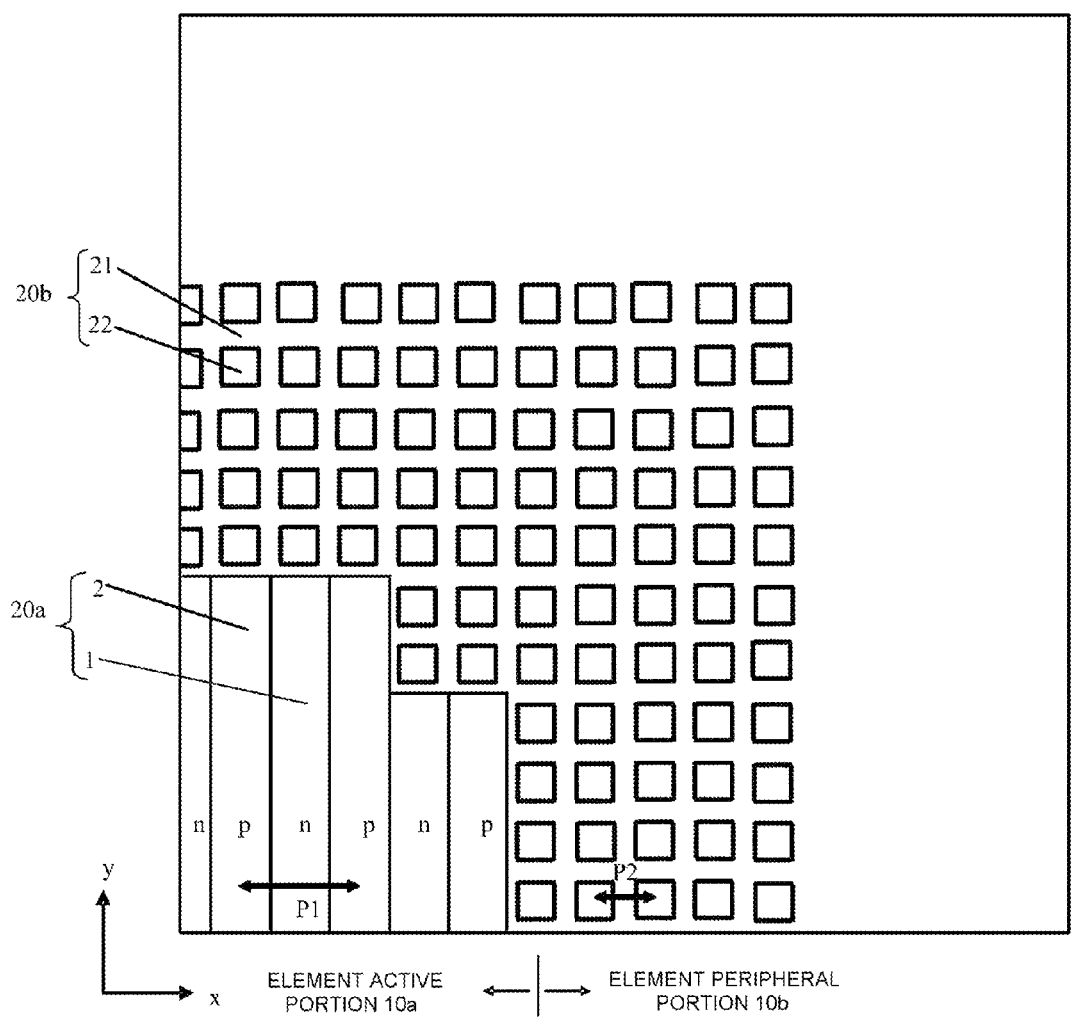
FIG. 3 is an internal plan view of the one-fourth element of the vertical superjunction MOSFET according to Embodiment 1 of the invention cut along a surface D-D' (shown in FIG. 4) parallel to a main surface.
Figure 4:
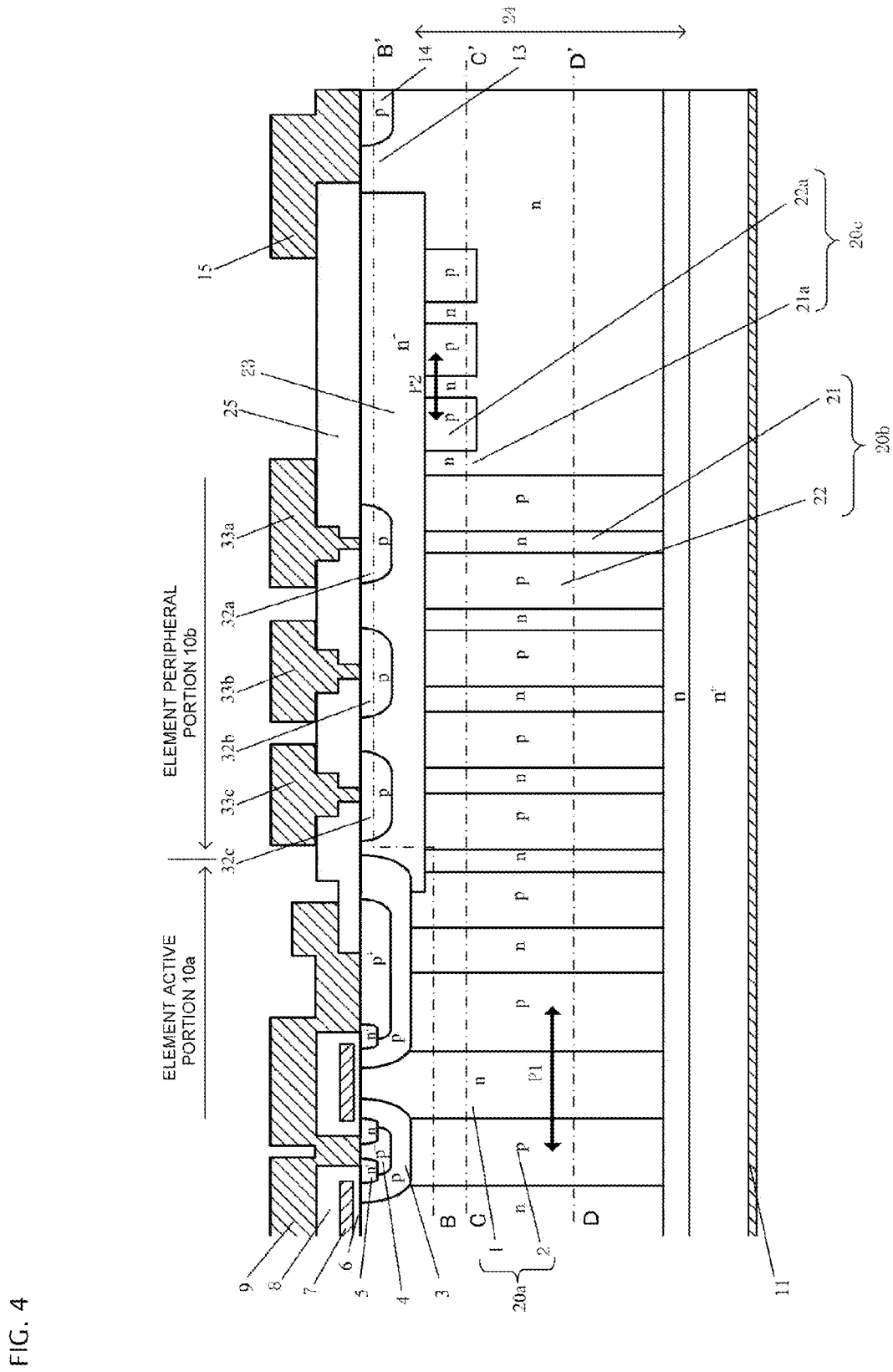
FIG. 4 is a sectional view of the vertical superjunction MOSFET according to Embodiment 1 of the invention cut in the position of a line A-A' (shown in FIG. 1)

FIGS. 1, 2, 3, and 4 each show a plan view or sectional view of a vertical superjunction MOSFET (hereafter, element) according to Embodiment 1 of the invention. FIG. 1 shows one portion (a one-fourth element of a quadrilateral chip cut into four equal portions by two perpendicular lines passing through the center of the chip) of a plan view of the element wherein, for ease of understanding, only underlying parallel pn layer 20a is shown in element active portion 10a, while a MOS surface structure disposed in the surface layer of parallel pn layer 20a and source electrode 9 are omitted. FIG. 1 can also be said to be an internal plan view cut along a surface B-B' (a surface parallel to the main surface) in FIG. 4, to be described hereafter. Element active portion 10a and, as element peripheral portion 10b encircling element active portion 10a, substrate surface p-type guard rings 32a, 32b, and 32c, n− region 23, n-type channel stopper 13 positioned on the outermost side, and p-type region 14 in the outermost periphery, are shown. The surface pattern of each region of parallel pn layer 20a in element active portion 10a is depicted in FIG. 1 in a striped form, but as a MOS surface structure is formed in the surface layer of the parallel pn layer, as previously mentioned, the striped pattern does not appear on the substrate surface. An A-A' line sectional view of the superjunction MOSFET shown in FIG. 1 is shown in FIG. 4. However, the MOS surface structure of element active portion 10a, source electrode 9, and field plates 33a, 33b, and 33c, field insulating film 25, and channel stopper electrode 15 provided on the p-type guard rings of the element peripheral portion, which are not shown in FIG. 1, are also shown in FIG. 4. The MOS surface structure has p-base region 3, p+ contact region 4, n+ source region 5, gate insulating film 6, gate electrode 7, and interlayer insulating film 8, and includes drain electrode 11 on the rear surface side of the element. Furthermore, FIG. 2, like FIG. 1, is an internal plan view (a one-fourth element) of a surface C-C' in FIG. 4 cut parallel to the main surface, while FIG. 3 is an internal plan view (a one-fourth element) of a surface D-D' in FIG. 4 cut parallel to the main surface.

FIG. 2 shows a structure wherein parallel pn layer 20b disposed in a lattice pattern surrounds the outer periphery of parallel pn layer 20a in element active portion 10a on the C-C' surface shown in FIG. 4. As can be seen from both FIG. 2 and FIG. 4, a pitch p2 of parallel pn layer 20b in element peripheral portion 10b is smaller than a pitch p1 of parallel pn layer 20a in element active portion 10a, and the low concentration surface n− region 23 is formed on the surface of parallel pn layer 20b. Rather than the widths of n-type drain regions 21 and 21a gradually changing from the element active portion 10a to the element peripheral portion 10b, the width of n-type drain region 21 simply decreases once together with the pitch decreasing from parallel pn layer 20a to parallel pn layer 20b, with the width being the same inside each parallel pn layer. Furthermore, a characteristic is that in element peripheral portion 10b according to the invention, parallel pn layer 20b is disposed as a layer wherein the depth of p-type partition region 22a further to the outer peripheral side than p-type guard ring regions 32a, 32b, and 32c is less than that of p-type partition region 22 on the inner peripheral side.

Figure 5:
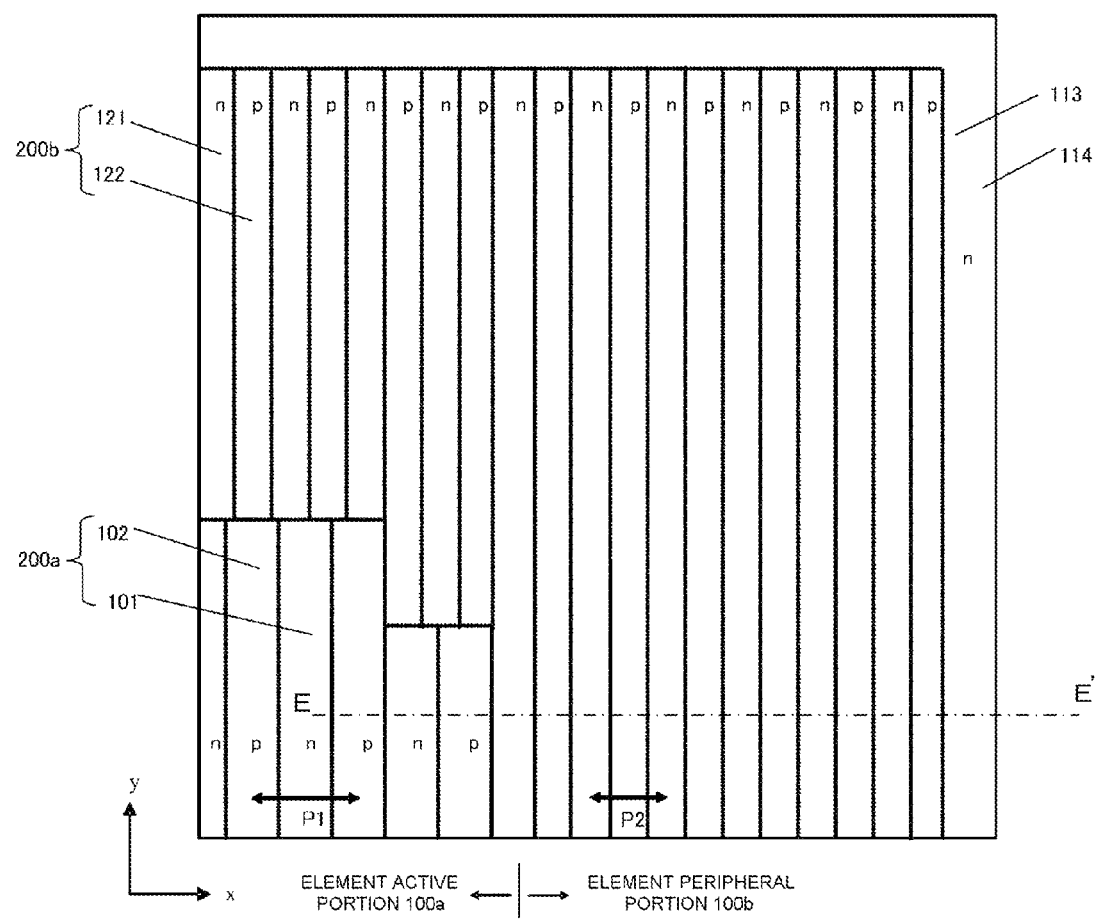
FIG. 5 is an internal plan view of the one-fourth element of the vertical superjunction MOSFET according to Embodiment 1 of the invention cut along a surface F-F' (shown in FIG. 7) parallel to a main surface.
Figure 6:
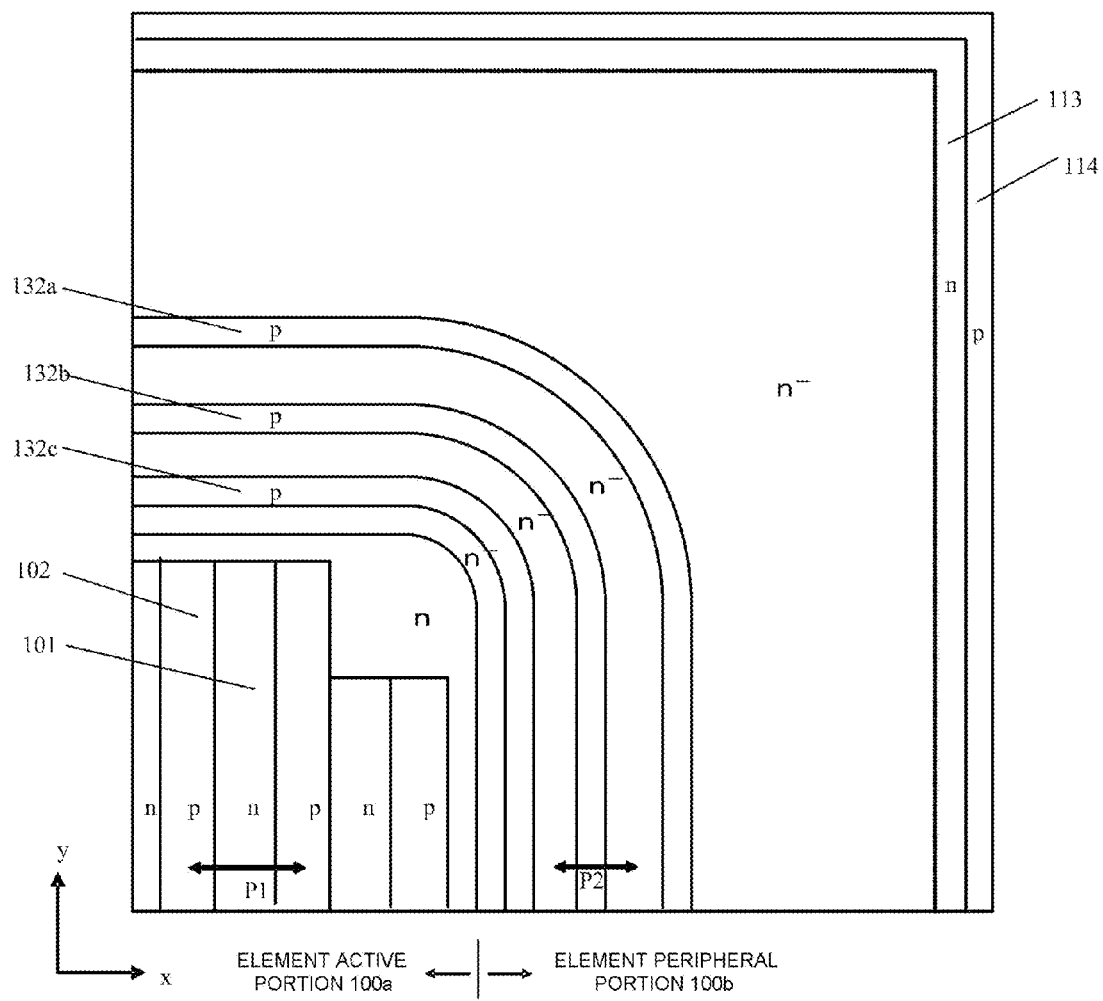
FIG. 6 is an internal plan view of the one-fourth element of the vertical superjunction MOSFET according to Embodiment 1 of the invention cut along a surface G-G' (shown in FIG. 7) parallel to a main surface.
Figure 7:
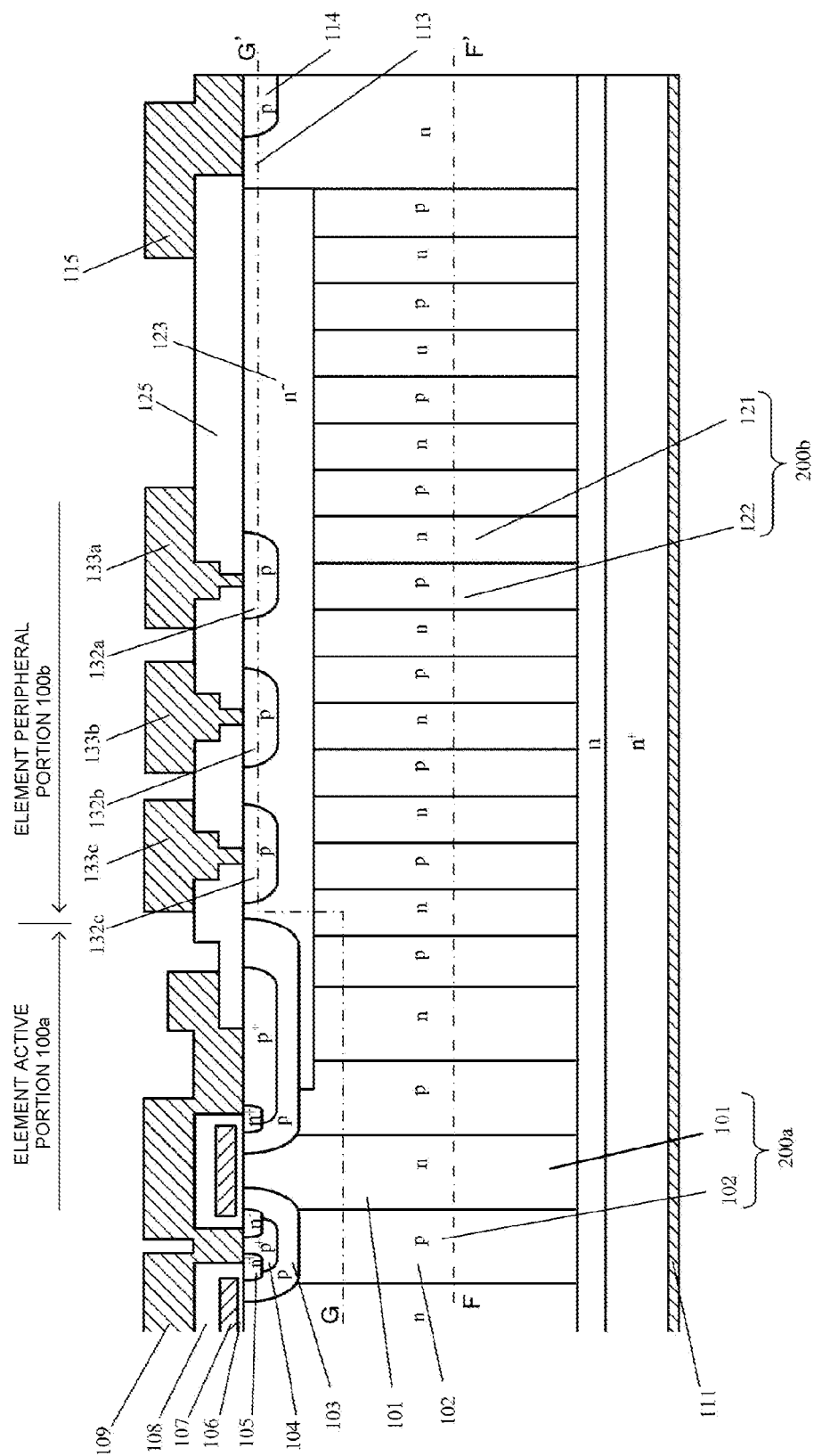
FIG. 7 is a sectional view of the vertical superjunction MOSFET according to Embodiment 1 of the invention cut in the position of a line E-E' (shown in FIG. 5)

At this point, in order to describe how the charge resistance of element peripheral portion 10b of the superjunction MOSFET according to the invention is superior, firstly, a description will be given of structural differences and the level of charge resistance in element peripheral portion 100b in a heretofore known superjunction MOSFET (hereafter, "the heretofore known element structure"). FIGS. 5, 6, and 7 show one portion (a one-fourth element) of a plan view, and a sectional view, of the heretofore known element structure. FIGS. 5 and 6 show an internal plan view of a surface F-F' in FIG. 7 cut parallel to the main surface, and an internal plan view of a surface G-G' in FIG. 7 cut parallel to the main surface. FIG. 7 corresponds to a sectional view of an E-E' line of FIG. 5, but furthermore, an MOS surface structure of element active portion 100a, source electrode 109, and field plates 133a, 133b, and 133c, field insulating film 125, and channel stopper electrode 115 provided on p-type guard rings 132a, 132b, and 132c of element peripheral portion 100b, which are not shown in FIG. 5, also are shown. For ease of understanding, in the same way as in FIG. 1, only underlying parallel pn layer 200a is shown in element active portion 100a of FIG. 5, while a MOS surface structure disposed in the surface layer of parallel pn layer 200a and source electrode 109 are omitted. P-type guard rings 132a, 132b, and 132c, n− region 123, n-type channel stopper 113 positioned on the outermost side of element peripheral portion 100b, and p-type region 114 in the outermost periphery are shown, in a substrate surface layer, as element peripheral portion 100b encircling element active portion 100a, as shown in FIGS. 6 and 7a. In the same way, a striped form parallel pn layer 200b disposed underlying the element peripheral portion is shown in FIG. 5.

In the superjunction MOSFET of the heretofore known element structure, the striped form parallel pn layer 200b, with a repeating pitch smaller than that in element active portion 100a, is disposed in element peripheral portion 100b, as shown in FIGS. 5 and 7. The structure of element peripheral portion 100b, in which surface n– region 123 and p-type guard rings 133a, 133b, and 133c are formed together with parallel pn layer 200b, is the same as that of the superjunction MOSFET of Embodiment 1 according to the invention. A difference from the invention is that the structure is such that, in the heretofore known element structure, the depth of p-type partition region 122 in parallel pn layer 200b of element peripheral portion 100b is uniform and unchanging from the inner periphery to the outer periphery, and the depth of p-type partition region 102 in element active portion 100a does not change either.

In this kind of element peripheral portion 100b of the heretofore known element structure, there is little problem when the surface of field insulating film 125 is positively charged, but when the surface is particularly negatively charged, there is a problem in that the depletion layer has low breakdown voltage and is liable to spread as far as an end of channel stopper electrode 115 via the parallel pn layer, an electrical field concentrates at channel stopper electrode 115, and breakdown often occurs at a low breakdown voltage lower than the design breakdown voltage.

Meanwhile, in the superjunction MOSFET of Embodiment 1, there is formed a structure wherein n– region 23 is formed together with p-type guard rings 32a, 32b, and 32c in the surface layer of element peripheral portion 10b, and the depth of p-type partition region 22a of parallel pn layer 20c on the outer peripheral side of element peripheral portion 10b is smaller than that of p-type partition region 22 on the inner peripheral side, as shown in FIGS. 1 to 3 and FIG. 4. By adopting this kind of structure, it is possible, owing to n– region 23 and p-type guard rings 32a, 32b, and 32c in the surface layer, to reduce an electrical field concentration on element active portion 20a side, thereby improving breakdown voltage charge resistance, when there is a positive charge, in the same way as heretofore known. Furthermore, with respect to a negative charge too, the effective impurity concentration of drift layer 24 is increased by reducing the depth of p-type partition region 22a in the outer peripheral portion of element peripheral portion 10b, it becomes difficult for the depletion layer to spread at an end of element peripheral portion 10b, and it is possible to reduce an electrical field concentration at an end of channel stopper 13. In Embodiment 1 according to the invention, as it is sufficient to be able to reduce only the electrical field concentration at the end of channel stopper 13, the depth of p-type partition region 22a is reduced only in a portion further toward the outer periphery than the p-type guard rings on the outer peripheral side of element peripheral portion 10b, while the depth of p-type partition region 22 on the inner peripheral side of element peripheral portion 10b is the same as that heretofore known. When reducing the depth of p-type partition region 22 on the inner peripheral side of the p-type guard ring region too, there is no problem when the element surface is negatively charged, but when the element surface is positively charged, the depletion layer does not spread sufficiently, and there is a danger of causing a drop in breakdown voltage, for which reason it is desirable that the depth of p-type partition region 22a is reduced only in a portion further toward the outer periphery than the p-type guard rings.

As previously described, it is sufficient, in order to prevent an overspreading of the depletion layer in the element peripheral portion and to prevent a low breakdown voltage breakdown, to increase the effective n-type impurity concentration of element peripheral portion 10b, and in particular, the n-type impurity concentration of the outer peripheral portion. A method whereby the width of the p-type partition region of parallel pn layer 20b on the outer peripheral side of element peripheral portion 10b is further reduced (narrowed) can be considered as a method of doing this. However, as the horizontal direction (a direction parallel to the substrate main surface) repeating pitch of the parallel pn layer is originally small, the processing accuracy required to further narrow the pitch is extremely high in comparison with a method whereby the depth is reduced. Consequently, in Embodiment 1 according to the invention, a method is used in which scope remains for a reduction in the repeating pitch with a view to future improvement in element performance, and the spread of the depletion layer is controlled by widely modulating the depth of the easily controlled p-type partition region. When the repeating pitch of the parallel pn layer becomes narrower, the distance between p-type partition regions 22 and 22a decreases, and the electrical field is more easily reduced, meaning that it is easy to increase the breakdown voltage. Furthermore, since conductive field plates 33a, 33b, and 33c are formed across insulating film 25 on the inner periphery and outer periphery of the p-type guard rings so as to be in conductive connection with the p-type guard rings, they can carry out a collection of extraneous charge as well as controlling the p-type guard ring electrical field reduction and depletion layer spread. Thus, conductive field plates 33a, 33b, and 33c also have a function of controlling fluctuation in breakdown voltage due to surface charge. As the field plates are connected to not only the outer periphery but also the inner periphery of the p-type guard rings, covering the surface, the extraneous charge collecting function is advanced.

Figure 8A:
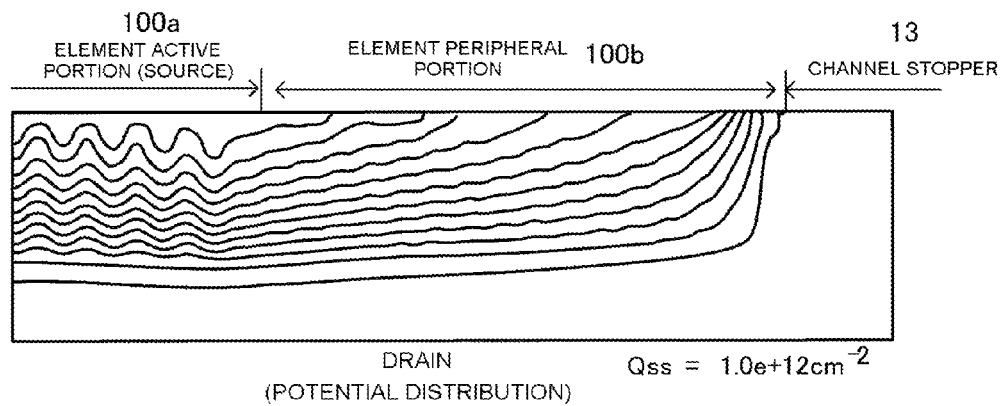
FIGS. 8A to 8C are potential distribution diagrams of a heretofore known element structure, a comparison example, and the superjunction MOSFET according to Embodiment 1 of the invention.
Figure 8B:
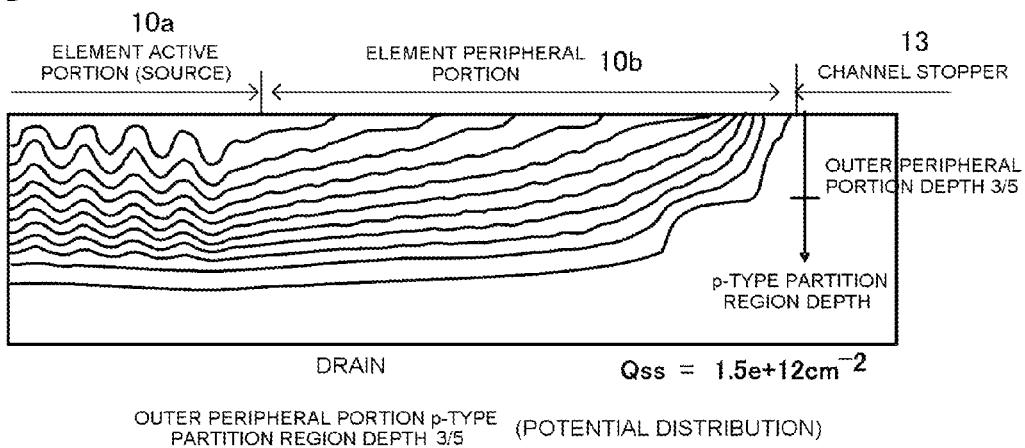
Figure 8C:
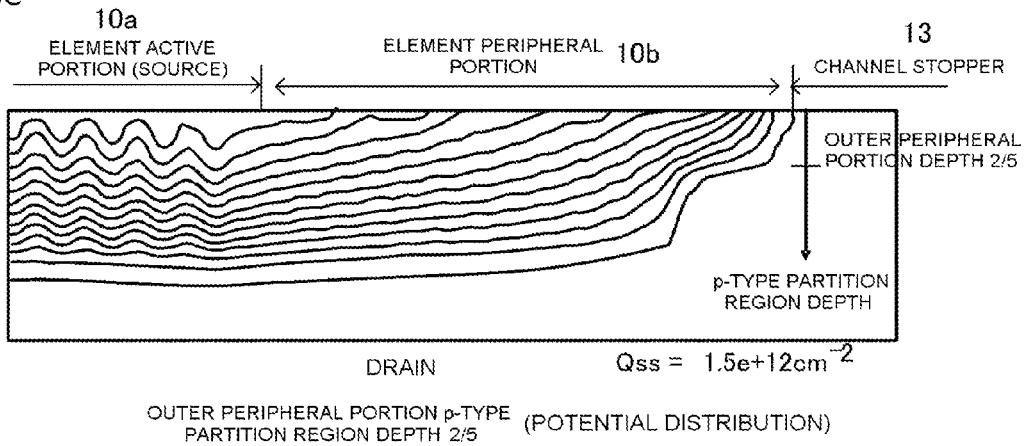
Figure 9A:
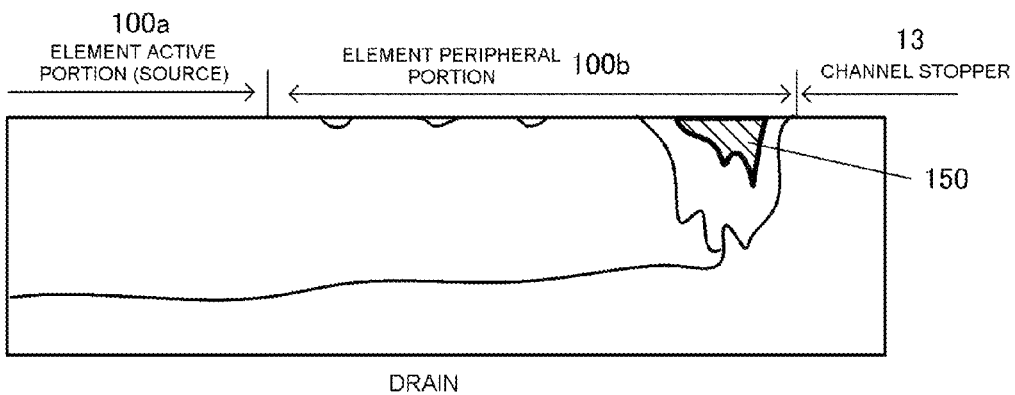
FIGS. 9A to 9C are impact ionization rate distribution diagrams of a heretofore known element structure, a comparison example, and the superjunction MOSFET according to Embodiment 1 of the invention.

FIGS. 8A to 8C and FIGS. 9A to 9C show results of simulating the charge resistance of the element peripheral portions in the heretofore known element structure and in the superjunction MOSFET according to Embodiment 1 of the invention. FIGS. 8A and 9A show a potential distribution diagram, wherein potential distribution is shown by equipotential lines, and the impact ionization rate when the surface charge amount of the negative charge applied to the surface of field insulating film 25 in the element peripheral portion of the heretofore known element structure is $Qss=-1.0\times10^{12}$ cm$^{-2}$. It is known that, in a MOSFET, electrons flowing from the source to the drain are accelerated in a high electrical field in the drain portion, and electrons and holes are generated by impact ionization. The impact ionization refers to a phenomenon whereby electrons accelerated by an electrical field generate electrons and holes by colliding with a crystal lattice, and the generation ratio is the impact ionization rate. As the impact ionization rate increases in a place in which there is an electrical field concentration, the impact ionization rate can indicate a place in which there is an electrical field concentration.

FIGS. 8B and 8C and FIGS. 9B and 9C show, respectively, potential distributions and impact ionization rates when the surface charge amount of a negative charge applied more strongly than in the case of the heretofore known element structure is $Qss=-1.5\times10^{12}$ cm$^{-2}$ in two cases, when the depth of p-type partition region 22a in the outer peripheral portion of element peripheral portion 10b is three-fifths (FIG. 9B) and two-fifths (FIG. 9C) the depth of p-type partition region 22 on the inner peripheral side, in a superjunction MOSFET of a comparison example and in the superjunction MOSFET of Embodiment 1 according to the invention. In order for the effect of a negative charge in the element peripheral portion to be easily understood, simulation is carried out with the ratio between the width of each p-type partition region 2 and the width of n-drift region 1 in parallel pn layer 20a at 1 to 1, which is a condition easily affected by a negative charge.

From the results shown in FIGS. 8A to 8C and 9A to 9C, it can be seen that in the heretofore known element structure, even when the surface charge amount is $Qss=-1.0\times10^{12}$ $cm^{-2}$, the depletion layer has already reached the channel stopper electrode, and an electrical field concentration has occurred, as shown in FIG. 8A, and this has caused a breakdown in diagonal line region 150 in the vicinity of the end of channel stopper 13, as shown in FIG. 9A.

Figure 9B:
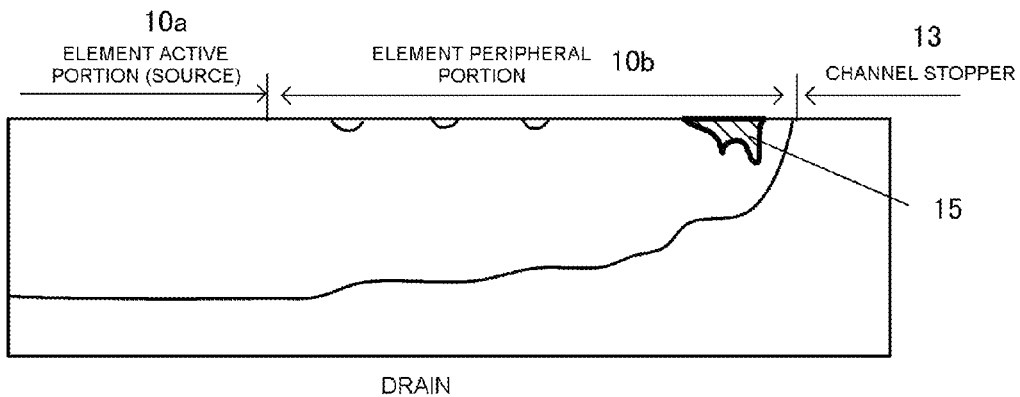

Meanwhile, it can be seen that when the depth of the p-type partition region described in Embodiment 1 is three-fifths, the extension of the depletion layer is suppressed more than in the heretofore known element structure, but an electrical field concentration starts to occur in the vicinity of the end of channel stopper 13 when the surface charge amount of the negative charge is $Qss=-1.5\times10^{12}$ $cm^{-2}$, as in FIG. 8B, and this has caused a breakdown in diagonal line region 15 in the vicinity of the end of channel stopper 13, as shown in FIG. 9B.

Figure 9C:
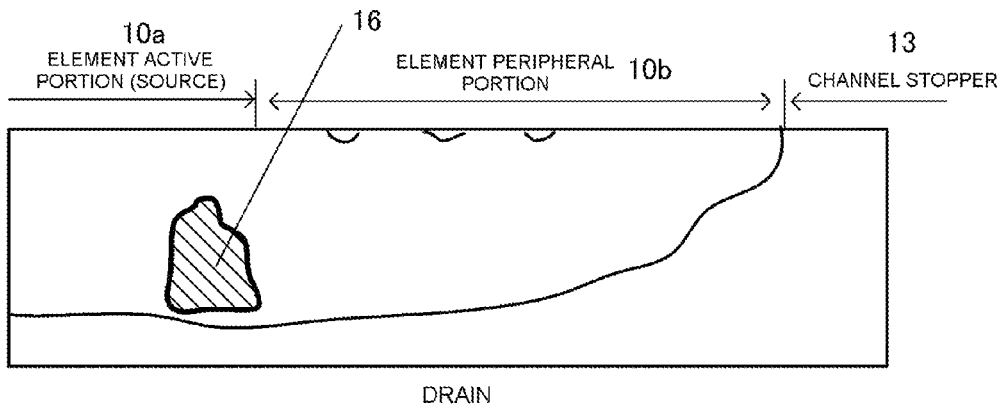

Further, when the depth of the p-type partition region is two-fifths, no electrical field concentration has yet occurred in the vicinity of the end of channel stopper 13, even with the same surface charge amount of $Qss=-1.5\times10^{12}$ $cm^{-2}$ as in FIG. 8B. This is shown in FIG. 8C, and it is shown in FIG. 9C that a breakdown is occurring in diagonal line region 16 on element active portion 10a side, rather than in the vicinity of channel stopper 13. As a breakdown in the element active portion occurs in a relatively flat junction surface, the degree of localized electrical field concentration is low, which is preferable because there is little drop in breakdown voltage.

Figure 10:
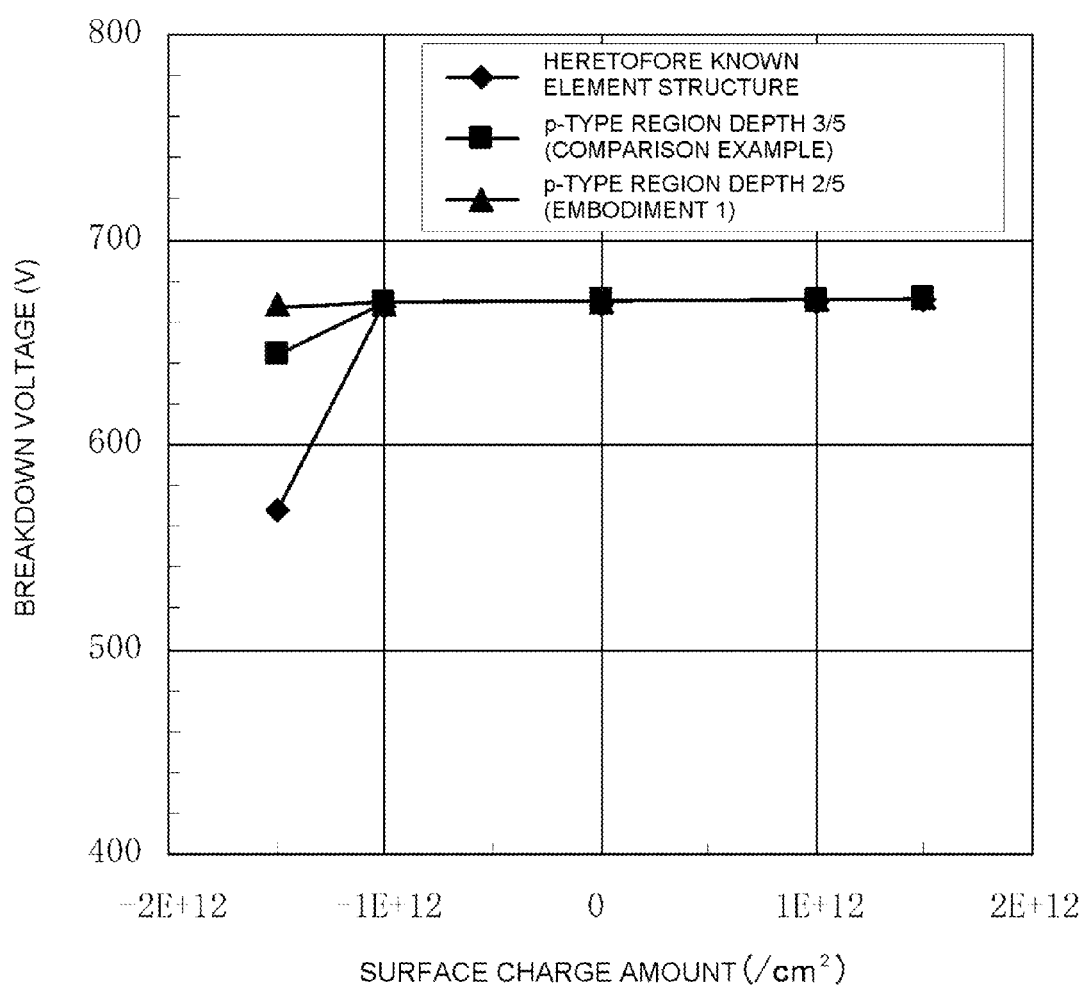
FIG. 10 is a diagram of a relationship between the surface charge amount (/cm2) and breakdown voltage, obtained by simulation, of the superjunction MOSFET of Embodiment 1 according to the invention.

FIG. 10 shows results of simulating the breakdown voltage value with respect to surface charge amounts (/cm2) in the superjunction MOSFET of Embodiment 1 according to the invention. As shown in FIG. 10, when the depth of p-type partition region 22a in the outer peripheral portion of the heretofore known element structure and element peripheral portion is three-fifths, the breakdown voltage drops when the surface charge amount is $Qss=-1.5\times10^{12}$ $cm^{-2}$, but the results show that in the superjunction MOSFET in which the depth of p-type partition region 22a is two-fifths (Embodiment 1 according to the invention), the breakdown voltage barely drops at all with a surface charge amount of $Qss=\pm1.5\times10^{12}$ $cm^{-2}$. Consequently, it can be seen from FIG. 10 that, by reducing the depth of p-type partition region 22a in the outer peripheral portion of the element peripheral portion, it is possible to improve the charge resistance in comparison with that of the heretofore known element structure in a surface charge amount range of $Qss=\pm1.5\times10^{12}$ $cm^{-2}$, and that it is desirable that the depth of p-type partition region 22a in the outer peripheral portion of the element peripheral portion is two-fifths or less.

From the above description, it can be seen that, by the configuration of the superjunction MOSFET according to Embodiment 1 of the invention being such that the depth of p-type partition region 22a in the outer peripheral portion of the element peripheral portion is smaller than the depth on the inner peripheral side, it is possible to achieve an improvement in the charge resistance of the superjunction MOSFET even when the surface charge amount applied to the surface of the field insulating film of the element peripheral portion of the superjunction MOSFET is as large as $Qss=\pm1.5\times10^{12}$ $cm^{-2}$, due to a resin mold seal or the like, and breakdown voltage reliability is thus improved.

Embodiment 2

Figure 11:
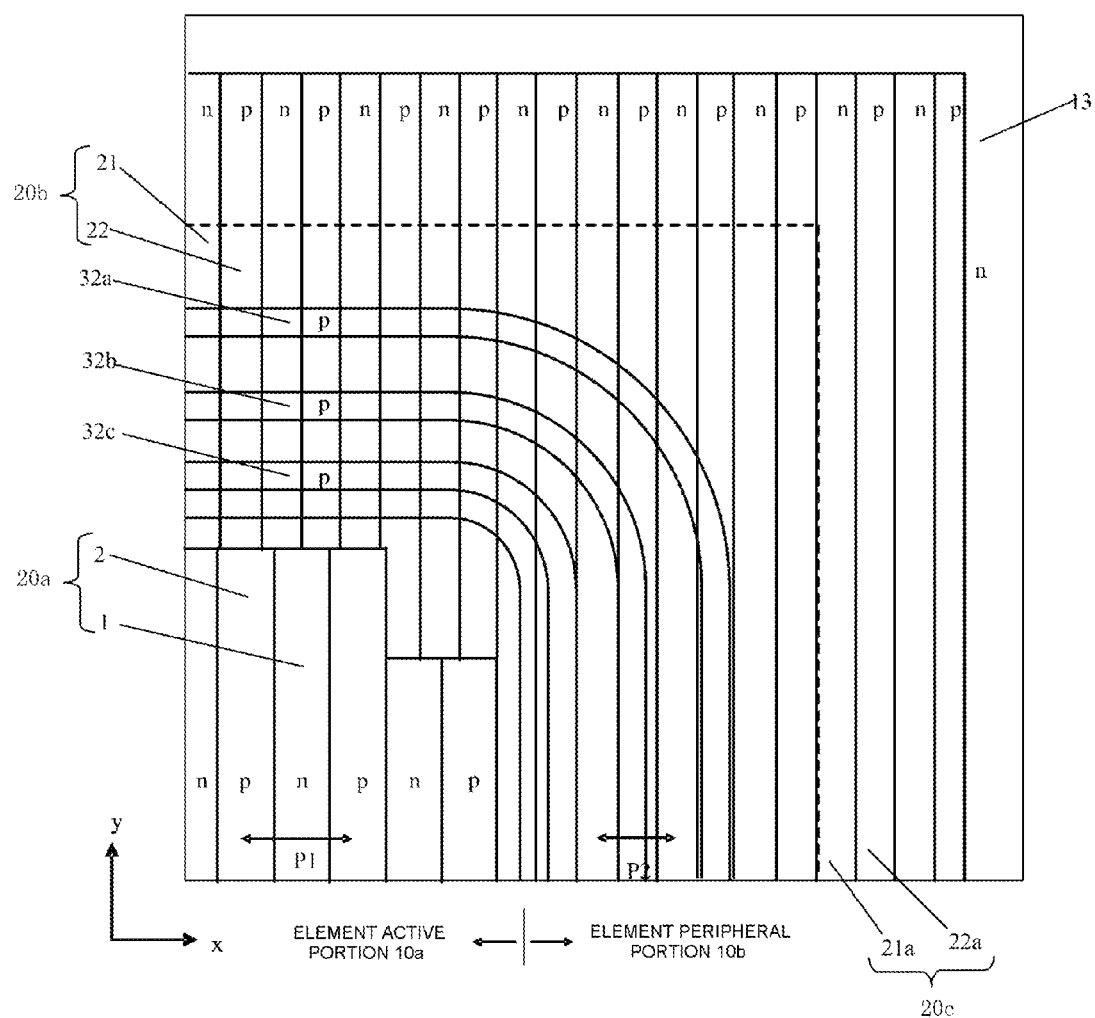
FIG. 11 is one portion (a one-fourth element) of a transparent plan view of a superjunction MOSFET of Embodiment 2 according to the invention.

FIG. 11 shows one portion (a one-fourth element) of a transparent plan view of a superjunction MOSFET of Embodiment 2 according to the superjunction semiconductor device of the invention. Although FIG. 11 is the same kind of internal plan view as FIG. 2, it is made a transparent view by a depiction of p-type guard rings 32a, 32b, and 32c being added. In the superjunction MOSFET shown in FIG. 11, the plane pattern of the parallel pn layer of element peripheral portion 10b being of a striped form differs from the superjunction MOSFET of FIG. 2, while other structures are the same as those in FIG. 2. That is, as opposed to Embodiment 1, the plane pattern of parallel pn layers 20b and 20c of element peripheral portion 10b is of a striped form rather than a lattice form, and the depth of p-type partition region 22a is reduced only on the outer peripheral side in element peripheral portion 10b. By reducing the depth of p-type partition region 22a, regardless of the form of parallel pn layers 20b and 20c of element peripheral portion 10b, the same advantage of the invention as in Embodiment 1 is obtained. Although the plane pattern of parallel pn layer 20a of element active portion 10a is of a striped form in Embodiments 1 and 2, a lattice form plane pattern may also be adopted.

Also, in Embodiments 1 and 2, the parallel pn layers are formed using a method called a multi-stage epitaxial method, whereby epitaxial growth is repeated several times, but it is also possible to adopt a method whereby the parallel pn layers are formed using a method embedding the p-type partition region by epitaxial growth in a trench formed by vertical etching from the surface of an n-type drift layer epitaxially grown over the whole surface, thereby manufacturing the superjunction MOSFET.

According to the superjunction semiconductor device of the heretofore described embodiments, it is possible to provide a superjunction semiconductor device with which it is not only possible to greatly improve the trade-off relationship between on-resistance and breakdown voltage, but also possible, the fluctuation of breakdown voltage due to surface charge being suppressed, to improve long-term breakdown voltage reliability.

Thus, a superjunction semiconductor device has been described according to the present invention. Many modifications and variations may be made to the techniques and structures described and illustrated herein without departing from the spirit and scope of the invention. Accordingly, it should be understood that the methods and devices described herein are illustrative only and are not limiting upon the scope of the invention.

ELEMENTS IN FIGURES

FIG. 1
Element active portion 10a
Element peripheral portion 10b
FIG. 2
Element active portion 10a
Element peripheral portion 10b FIG. 3
Element active portion 10a
Element peripheral portion 10b
FIG. 4
Element active portion 10a
Element peripheral portion 10b
FIG. 5
Element active portion 100a
Element peripheral portion 100b
FIG. 6
Element active portion 100a
Element peripheral portion 100b
FIG. 7
Element active portion 100a
Element peripheral portion 100b
FIG. 8A
100a Element active portion (source)
100b Element peripheral portion
13 Channel stopper
A Drain
B (potential distribution)
FIG. 8B
10a Element active portion (source)
10b Element peripheral portion
13 Channel stopper
A Drain
B Outer peripheral portion p-type partition region depth 3/5 (potential distribution)
C Outer peripheral portion depth 3/5
D p-type partition region depth
FIG. 8C
10a Element active portion (source)
10b Element peripheral portion
13 Channel stopper
A Drain
B Outer peripheral portion p-type partition region depth 2/5 (potential distribution)
C Outer peripheral portion depth 2/5
D p-type partition region depth
FIG. 9A
100a Element active portion (source)
100b Element peripheral portion
13 Channel stopper
A Drain
FIG. 9B
10a Element active portion (source)
10b Element peripheral portion
13 Channel stopper
A Drain
FIG. 9C
10a Element active portion (source)
10b Element peripheral portion
13 Channel stopper
A Drain
FIG. 10
A Breakdown voltage (V)
B Surface charge amount (/cm$^2$)
C Heretofore known element structure
D p-type region depth 3/5 (comparison example)
E p-type region depth 2/5 (Embodiment 1)
FIG. 11
Element active portion 10a
Element peripheral portion 10b

What is claimed is:

1. A superjunction semiconductor device comprising:
a first conductivity type semiconductor substrate having two main surfaces;
a first conductivity type drift layer having two regions comprising a plurality of first conductivity type drift regions and second conductivity type partition regions disposed in alternate contact between the two main surfaces of the first conductivity semiconductor substrate;
an element active portion through which a main current flows, with a first region of the drift layer which is in the element active portion including first parallel pn layers; and
a ring-like element peripheral portion having inner and outer peripheral portions, the ring-like element peripheral portion encircling the element active portion, with a second region of the drift layer which is in the peripheral portion having second parallel pn layers the peripheral portion further comprising a first conductivity type surface layer region which covers the surface of the second parallel pn layers, the first conductivity type surface layer region having an impurity concentration lower than that of the drift layer,
the ring-like element peripheral portion further comprising second conductivity type partition regions, wherein all partition regions in the outer peripheral portion of the ring-like peripheral portion have a depth which is less than the depth of partition regions in the inner peripheral portion of the ring-like peripheral portion, and
two or more second conductivity type guard ring regions disposed in the inner peripheral portion of the element peripheral portion and distanced from each other so as to surround the outer periphery of the first parallel pn layer in the surface layer of the low concentration first conductivity type surface layer region,
wherein the two regions in the drift layer each have a width such that a depletion layer spreading in the two regions from the pn junction between the two regions when an off-state voltage is applied to the main junction can deplete the drift layer,
wherein the repeating pitch interval of the second parallel pn layers in the ring-like element peripheral portion encircling the element active portion is smaller than the repeating pitch interval of a first parallel pn layers in the element active portion, and
wherein the depth of the second conductivity type partition regions in the outer peripheral portion are the same.

2. The superjunction semiconductor device according to claim 1, wherein the depth of the second conductivity type partition region of the outer peripheral portion in the ring-like element peripheral portion is two-fifths or less the depth of the second conductivity type partition region of the inner peripheral portion.

3. The superjunction semiconductor device according to claim 1, further comprising conductive field plates placed on the inner peripheral side and outer peripheral side of the surfaces of the second conductivity type guard ring regions in conductive connection with the second conductivity type guard ring regions.

4. The superjunction semiconductor device according to claim 1, wherein the plane pattern of the parallel pn layers in the element active portion and element peripheral portion is a striped form.

5. The superjunction semiconductor device according to claim 1, wherein the plane pattern of the parallel pn layers in the element active portion and element peripheral portion is a lattice form.

6. The superjunction semiconductor device according to claim 2, wherein the plane pattern of the parallel pn layers in the element active portion and element peripheral portion is a striped form.

7. The superjunction semiconductor device according to claim 2, wherein the plane pattern of the parallel pn layers in the element active portion and element peripheral portion is a lattice form.

8. The superjunction semiconductor device according to claim 1, wherein the depth of the second conductivity type partition region of the outer peripheral portion in the ring-like element peripheral portion is three-fifths or less the depth of the second conductivity type partition region of the inner peripheral portion.

* * * * *